United States Patent [19]

Eriksson et al.

[11] Patent Number: 5,352,983
[45] Date of Patent: Oct. 4, 1994

[54] METHOD AND APPARATUS FOR DETECTING FLASHOVER BETWEEN CONDUCTORS IN POWER TRANSMISSION LINES OF DIFFERENT VOLTAGE LEVELS SUSPENDED IN PARALLEL FROM THE SAME TOWERS

[75] Inventors: Leif Eriksson, Sala; Murari M. Saha, Västerås, both of Sweden

[73] Assignee: Asea Brown Boveri AB, Västerås, Sweden

[21] Appl. No.: 983,728

[22] Filed: Dec. 1, 1992

[30] Foreign Application Priority Data

Dec. 20, 1991 [SE] Sweden ............................ 9103798-6

[51] Int. Cl.$^5$ ............................................ G01R 31/08
[52] U.S. Cl. ................................... 324/522; 324/539; 340/664; 364/492
[58] Field of Search ............... 324/512, 522, 536, 539, 324/555; 364/483, 492; 340/650, 660, 664

[56] References Cited

U.S. PATENT DOCUMENTS

| | | | |
|---|---|---|---|
| 4,251,766 | 2/1981 | Souillard | 324/522 X |
| 4,499,417 | 2/1985 | Wright et al. | 324/522 X |
| 4,559,491 | 12/1985 | Saha | 324/522 |
| 4,800,509 | 1/1989 | Nimmersjö | 324/522 X |
| 4,855,861 | 8/1989 | Bergman et al. | 324/522 X |
| 4,868,704 | 9/1989 | Cavero | 324/522 X |
| 4,906,937 | 3/1990 | Wikström et al. | 324/522 |

OTHER PUBLICATIONS

"Distance Protection of Double-Circuit Lines with Different Rated Voltages During Intersystem Faults", H. Becker et al, Cigre Conference paper 34-206, Paris 1990.

Primary Examiner—Gerald R. Strecker
Assistant Examiner—Diep Do
Attorney, Agent, or Firm—Watson, Cole, Grindle & Watson

[57] ABSTRACT

The invention relates to a method and a device for detecting a flashover between conductors in power transmission lines of different voltage levels suspended from the same towers and wherein the power lines are included in a power network where one of the power lines is stated to be a high-voltage power line (1) and where the other power lines are connected to the high-voltage line via transformers of a known transformer ratio (am) and internal impedance (ZXm) and wherein the line impedances (ZL) are known. Specific to the invention is that the fault current which is caused by a flashover is set to be equal to a detected current change in any of the phases in the high-voltage line. With this assumption an equation system can be set up with the aid of which the relative distance to fault n ($0 < n < 1$) can be determined. If the produced value of n lies within the stated region, this is interpreted as if an internal flashover has occurred.

2 Claims, 1 Drawing Sheet

METHOD AND APPARATUS FOR DETECTING FLASHOVER BETWEEN CONDUCTORS IN POWER TRANSMISSION LINES OF DIFFERENT VOLTAGE LEVELS SUSPENDED IN PARALLEL FROM THE SAME TOWERS

TECHNICAL FIELD

For environmental and cost reasons, particularly in densely populated areas, several power transmission lines with different voltage levels are allowed to be suspended from the same towers. This arrangement will hereinafter be referred to as a multi-circuit transmission line. Each one of the lines included is in the usual manner provided with protective devices in the form of impedance protection, ground-fault protection, differential protection etc. and with devices for fault location. All of these protective devices are based on current and voltage measurement either at one or at the other end or on simultaneous measurement at both ends of the respective line.

Since the lines in a multi-circuit system are normally suspended in such a way that there may be only a few meters between conductors belonging to different voltage levels, factors such as heavy wind, ice formation on the individual conductors, fallen trees and other things may cause these conductors to come into contact with each other. In certain unfortunate cases, the contact between the conductors may last for quite a long time, among other things because of the conductors being welded together or the like. In the following such a fault will be referred to as a flashover fault. If the flashover fault occurs within the protective zone of the protective devices, the fault will be called an intersystem fault. Even if it is a question of a fault of very short duration, an intersystem fault gives rise to changed current and voltage conditions at the fault location and may in certain cases also entail a risk of personal injury.

Such faults should, of course, be identified and be acted upon in some way as quickly as possible. However, the above-mentioned protective devices provide no, or insignificant, information as to the occurrence of an intersystem fault. The present invention relates to a method and a device for detection of an intersystem fault in a multi-circuit transmission line.

BACKGROUND ART, DISCUSSION OF THE PROBLEMS

A method for detecting an intersystem fault in the multi-circuit transmission line which comprises two lines of different voltages is described in Cigre Conference paper 34-206, Paris 1990, by H Becker, J Nilges and H Dirtrich entitled "Distance protection of double-circuit lines with different rated voltages during intersystem faults". The method is based on the distance protection principle.

To be able to selectively detect a short circuit according to the above-mentioned principle, it is necessary, when a short circuit occurs, to have access to correct values of currents and voltages at the measuring station. With the aid of the measured values at the instance of the fault, the circuit impedance, which corresponds to the positive-sequence impedance from the measuring station to the fault location, can be calculated. The method uses two current compensations which comprise the zero-sequence currents in the two lines and the corresponding voltages, which must be available at the same time. To detect an intersystem fault according to this method, it is thus assumed that the two lines can communicate with each other to be able to transmit measured fault quantities between the lines. This is, per se, a source of problems and it would therefore be a great advantage to have access to a method which is able to detect intersystem faults without having to communicate between the different lines. The present invention permits such a solution.

SUMMARY OF THE INVENTION

The invention comprises a method for detecting a flashover between the conductors in power transmission lines of different voltage levels suspended from the same towers and wherein the power lines are included in a power network where one of the power lines is stated to be a high-voltage power line (1) and where the other power lines are connected to the high-voltage line via transformers of a known ratio (am) and internal impedance (ZXm) and wherein the line impedances (ZL) are known.

The principle of the detection of an intersystem fault in a multi-circuit transmission line will be described starting from a system comprising two lines according to FIG. 1. This figure shows the voltage sources of the lines with the respective source impedances. The line impedances are designated ZL. The phase voltages in line 1 are designated U1R, U1S and U1T and the respective phase currents I1R, I1S and I1T. Further, it is assumed that line 2 receives its voltage via a transformer TR, connected to line 1, with the ratio a2 and an internal impedance ZX2. The phase voltages of line 2 are correspondingly designated U2R, U2S and U2T and the respective phase currents I2R, I2S, I2T.

Figure 1:
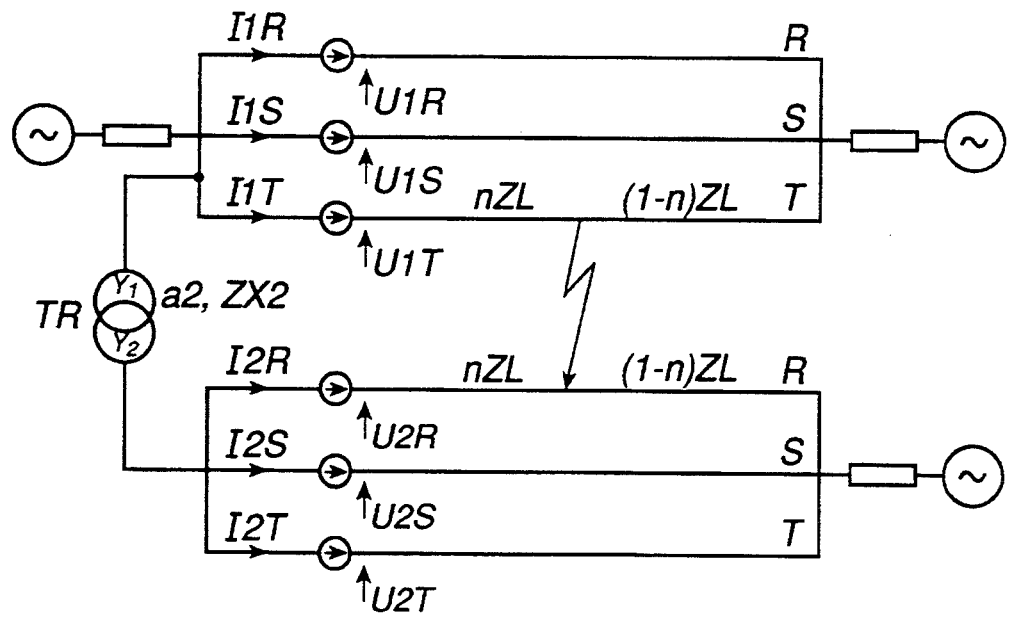
FIG. 1 shows a multi-circuit transmission line comprising two lines between which an intersystem fault has occurred.

If we start from the assumption that line 1 is that of the two lines which has the highest voltage, then when an intersystem fault occurs, for example between phases T1 and R2 as shown in FIG. 1, the current I1T before the fault will have a considerable fault current addition $\Delta$I1T. This fault current addition will then also be superimposed on the current I2R passing in phase R2 before the fault. This circuit is then closed via the transformer. To avoid communication between the two lines to include I2R in the calculations, according to the invention it is assumed that I2R is equal in magnitude to $\Delta$I1T. Since the current addition $\Delta$I1T is normally also considerably higher than the phase current I2R before the fault, this assumption entails no major fault in the detection method according to the invention.

In the case of an intersystem fault between phases T1 and R2, the following equations may be set:

$$\Delta I1T + I2R = 0 \tag{1}$$

$$U2R = U1R/a2 - I2R \cdot ZX2 \tag{2}$$

$$U1T - n \cdot ZL \cdot I1T + I2R \cdot n \cdot ZL - U2R = 0 \tag{3}$$

where n·ZL is the line impedance from the measuring station to the fault location at F at the relative fault distance n, that is, $0 < n < 1$.

The assumption according to equation (1) constitutes the main part of the inventive concept, namely, that the current in line 2 can be estimated without measuring it.

Equation (2) shows how the phase voltage of line 2 can be calculated and equation (3) indicates a relationship between the voltage drops between the measuring point for voltage on line 1 and the imaginary measuring point for voltage on line 2.

When current and voltage in line 2 have been obtained from equations (1) and (2), these values can be inserted in equation (3), that is, the only remaining quantity "n" can be solved. Now, if the value of "n" obtained in this way lies within the region of operation, that is, $0 < n < 1$, this indicates that the flashover is an intersystem fault which is to lead to tripping of the relevant phases.

In general terms, a flashover fault may occur between any of the phases of line 1 and any of the phases of line 2. To obtain a fully covering protection for the two lines, "n" must therefore be continuously determined for all conceivable permutations of flashover faults.

In transformers connected to a neutral point, $\Delta I1T$ is allowed to replace both I2R and a possible neutral point current IN.

Figure 2:
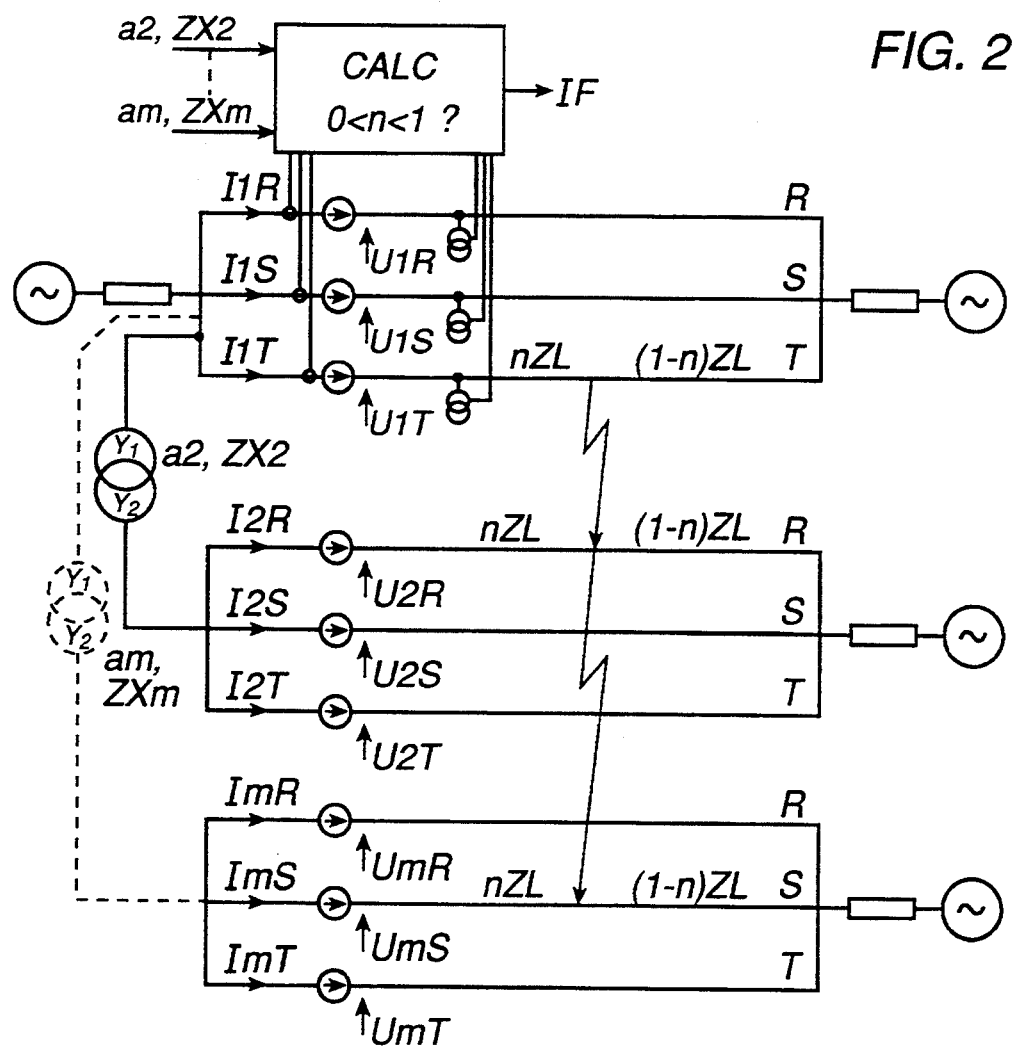
FIG. 2 shows a multi-circuit transmission line comprising a plurality of lines between which an intersystem fault has occurred and how a flashover indicating device CALC can be connected to one of the lines.

The method for detection of intersystem faults described above can also be directly applied to a multi-circuit transmission line comprising an optional number of parallel lines. This is illustrated in FIG. 2 by the lines 1 and 2 according to FIG. 1 being supplemented by up to m parallel lines connected to line 1 via separate transformers. It is indicated here that the m'th transformer has a ratio equal to am and an internal impedance equal to Zxm. In a corresponding way, as described above, the phase voltages are designated UmR, UmS and UmT and the phase currents ImR, ImS and ImT. As an example of an intersystem fault between several lines, it is shown in FIG. 2 that an interconnection has been performed between phase T of line 1 and phase R of line 2 and with phase S of line m.

The equation system which applies to an optional number of parallel lines will then be as follows:

$$\Delta I1\alpha + I2\beta + I3\gamma + \ldots + Im\phi = 0 \quad (4)$$

$$U2\beta = U1\beta/a2 - I2\beta \cdot ZX2 \quad (5)$$

$$U3\gamma = U1\gamma/a3 - I3\gamma \cdot ZX3 \quad (5a)$$

$$\vdots$$

$$Um\phi = U1\phi/am - Im\phi \cdot ZXm \quad (6)$$

$$U1\alpha - n \cdot ZL \cdot I1\alpha + n \cdot ZL \cdot I2\beta - U2\beta = 0 \quad (7)$$

$$U1\alpha - n \cdot ZL \cdot I1\alpha + n \cdot ZL \cdot I3\gamma - U3\gamma = 0 \quad (7a)$$

$$\vdots$$

$$U1\alpha - n \cdot ZL \cdot I1\alpha + n \cdot ZL \cdot Im\phi - Um\phi = 0 \quad (8)$$

where $\alpha$, $\beta$, $\gamma$ and $\phi$ may be R-, S- or T-phase.

In these applications it is practical to assume line 1 to be the one with the highest voltage, hereinafter referred to as the high-voltage line. When a flashover occurs, the high-voltage line is practically always involved.

To sum up, equations (4) to (8) may be interpreted as follows:

Equation (4) gives the relationship between currents on the high-voltage line and other lines of lower voltage.

Equations (5), (5a) . . . (6) indicate the phase voltage on the lines to which lower voltage is applied.

Equations (7), (7a) . . . (8) indicate the relationship between the voltage drops between the measuring point for the voltage on the high-voltage line and the imaginary measuring point for the voltage on the other lines.

Now, if the number of lines suspended in parallel is "m", the equation system will comprise (2m+1) complex equations which comprise 2m complex unknown variables and the sought variable "n" which can thus be determined.

For purely practical reasons, there is a limit to how many parallel lines may be suspended from the same towers. In practice, this also limits the number of relevant equations and the permutations which continuously need to be completed to be able to detect a flashover.

Since, as mentioned above, the high-voltage line is practically always involved when a flashover occurs, it is sufficient to connect to the measuring point for the high-voltage line a flashover indicating device CALC, according to FIG. 2, which is prepared with relevant equations as above. The flashover indicating device is fed with the voltages and currents of its own line and includes a possibility of determining a $\Delta I1\alpha$-value. In addition, the flashover indicating device shall be provided with knowledge of the line impedances as well as transformer ratio and impedance of all the lines involved. To reduce time and location for the continuous determination as to whether an "n" value lies within the protective zone, the determination may start when the $\Delta I1\alpha$-value exceeds a limit value $\Delta I\alpha g$, which normally originates from a flashover.

We claim:

1. Apparatus for detecting a flashover between conductors in power transmission lines of different voltage levels suspended from the same towers, comprising:

a power network comprising the power lines and wherein one of the power lines is a high voltage power line and the other power lines are connected to the high voltage power line via transformers of a known transformer ratio (am) and internal impedance (ZXm), and wherein the line impedances (ZL) are known;

a flashover indicating means (CALC) storing the known transformer ratios (am), the line impedances (ZL) and the internal impedances (ZXm) for determining the occurrence of a flashover;

said flashover indicating means receiving the phase currents I1 and phase voltages U1 of the high voltage line and detecting a current change I1 in any of the phases in the high voltage line and calculating the following parameters:

$$\Delta I1\alpha + I2\beta + I3\gamma + \ldots + Im\phi = 0$$

$$U2\beta = U1\beta/a2 - I2\beta \cdot ZX2$$

$$U3\gamma = U1\gamma/a3 - I3\gamma \cdot ZX3$$

$$\vdots$$

$$Um\phi = U1\phi/am - Im\phi \cdot ZXm$$

$$U1\alpha - n \cdot ZL \cdot I1\alpha = n \cdot ZL \cdot I2\beta - U2\beta = 0$$

$$U1\alpha - n \cdot ZL \cdot I1\alpha + n \cdot ZL \cdot I3\gamma - U3\gamma = 0$$

$$\vdots$$

$$U1\alpha - n \cdot ZL \cdot I1\alpha = n \cdot ZL \cdot Im\phi - Um\phi = 0$$

where $\alpha$, $\beta$, $\phi$ and $\gamma$ may be R-, S- or t-phase and n·ZL is the line impedance from the measuring station to the fault location (F) at the relative distance to fault n, whereby fault n can be determined; and said flashover determining means generates a signal IF for indicating that a flashover has occurred within the protective zone if $0 < n < 1$.

2. Apparatus for detecting a flashover according to claim 1, wherein said flashover determining means operates only when the detected current change $\Delta I1\alpha$ exceeds a pre-set limit value $\Delta I\alpha g$.

* * * * *